(12) United States Patent  
Kim

(10) Patent No.: US 7,009,274 B2  
(45) Date of Patent: Mar. 7, 2006

(54) FUSE BOX SEMICONDUCTOR DEVICE

(75) Inventor: Hyun-Chul Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 156 days.

(21) Appl. No.: 10/731,270

(22) Filed: Dec. 8, 2003

(65) Prior Publication Data

US 2004/0113233 A1 Jun. 17, 2004

(30) Foreign Application Priority Data

Dec. 10, 2002 (KR) .................. 10-2002-0078527

(51) Int. Cl.  
*H01L 29/00* (2006.01)

(52) U.S. Cl. ..................................... 257/529; 257/530

(58) Field of Classification Search ................ 257/529, 257/530, 758, 750; 365/225.7  
See application file for complete search history.

(56) References Cited

U.S. PATENT DOCUMENTS 5,389,814 A * 2/1995 Srikrishnan et al. ........ 257/529  
2002/0014680 A1 2/2002 Tottori

* cited by examiner

*Primary Examiner*—David Nelms  
*Assistant Examiner*—Thinh T Nguyen  
(74) *Attorney, Agent, or Firm*—Marger Johnson & McCollom, P.C.

(57) ABSTRACT

A fuse box includes a semiconductor substrate having a fuse region, and a lower line in the fuse region that has a first region and a second region. An upper line is placed on the upper part of the lower line to overlap the first region. A fuse is placed on the upper part of the upper line, and connects electrically to the second region of the lower line and the upper surface of the upper line. A lower interlayer insulating layer is interposed between the lower line and the upper line, and an upper interlayer insulating layer is interposed between the upper line and the fuse. The fuse is formed on the upper interlayer insulating layer. Both ends of the fuse connect electrically to the second region of the lower line and the upper line, respectively, through fuse holes penetrating the lower and upper interlayer insulating layers.

20 Claims, 11 Drawing Sheets

FUSE BOX SEMICONDUCTOR DEVICE

CROSS REFERENCE TO RELATED APPLICATIONS

This application claims priority from Korean Patent Application No. 2002-78527, filed on Dec. 10, 2002, the content of which is hereby incorporated by reference in its entirety.

BACKGROUND OF INVENTION

1. Field of the Invention

This disclosure relates to a semiconductor device, and more particularly, to a fuse box of a semiconductor device and a fabrication method thereof.

2. Description of the Related Art

Semiconductor devices (chips) formed on a semiconductor substrate are electrically tested prior to an assembly process. As a result, the semiconductor devices may be classified as either "good" chips or "bad" chips. In the case where bad chips malfunction due to at least one bad cell, the bad cell can be replaced with a redundant cell by a repair process.

The repair process includes a step of cutting some fuses using laser beam irradiation such that the redundant cell has the address of the bad cell in a writing mode and a reading mode.

The fuses are generally formed of bit lines, which data is transmitted through, at the same time. Further, the bit lines are typically formed under metal lines. Particularly, a semiconductor device such as DRAM has cell capacitors interposed between the metal lines and the bit lines. Therefore, the total thickness of an interlayer insulating layer stacked on the upper part of the fuses may be greater than 1 $\mu$m.

FIG. 1A is a plan diagram showing a fuse box formed according to the conventional art.

Referring to FIG. 1A, a fuse box 60 includes several fuses 15 aligned in line, a guard ring 47 having a plate line 25 for defining the area of the fuse box 60, a contact hole 40 and an upper metal line 45, and a window 55 formed in the fuse box 60.

The fuse box 60 includes the window 55 for opening the fuses 15, which are formed at the central region of the fuse box 60. The window 55 allows the fuses 15 to be effectively cut by the laser beam. The plate line 25 is formed of a conductive layer.

However, as the integration density of semiconductor devices increase, the pitch of the fuses 15 gradually decrease. In this case, when a selected fuse in the fuse box 60 is cut by the laser beam, other fuses adjacent to the selected fuse may be damaged. To solve the above problem, the pitch of the fuse 15 should be increased.

To increase the pitch of the fuses 15, the area of the fuse box 60 containing the fuses 15 is increased, resulting in a decrease of the integration density in the semiconductor device.

FIGS. 1B to 1D are cross-sectional diagrams taken along the line I–I' of FIG. 1A for illustrating a fabrication method of the conventional fuse box.

Referring to FIGS. 1B to 1C, a first insulating layer 10 is formed on a semiconductor substrate 5, and a plurality of fuses 15 are formed on predetermined regions of the first insulating layer 10 to be parallel with each other. The fuses 15 are typically formed of a conductive layer such as a tungsten polycide layer. Then, a second insulating layer 20 is formed on the whole surface of the semiconductor substrate having the fuses 15. Next, conductive layer patterns 25a, 25b are formed on the second insulating layer. The conductive layer patterns 25a, 25b are formed from the same doped polysilicon layer as the plate line of FIG. 1A, and are referred to as the first and the second conductive layer patterns, respectively.

A third and a fourth insulating layer 30, 35 are formed sequentially on the whole surface of the semiconductor substrate 5 having the conductive layer patterns 25a, 25b. And the third and fourth insulating layers 30, 35 are etched in sequence to form a contact hole 40, which exposes the top surface of the first conductive layer pattern 25a. Then, an upper metal line 45 is formed on the semiconductor substrate 5 having the contact hole 40. The upper metal line 45 buries the contact hole 40 and is formed on the top surface of the fourth insulating layer 35 to overlap the contact hole 40. At this time, the upper metal line 45 is electrically connected to the first conductive layer pattern 25a through the contact hole 40. The first conductive layer pattern 25a and the upper metal line 45 together with the contact hole 40 form a guard ring 47 as shown in FIG. 1A. A fifth insulating layer 50, such as a passivation layer, is formed on the whole surface of the semiconductor substrate 5 having the upper metal line 45. The fifth insulating layer 50 includes at least one layer. As a result, several insulating layers may be stacked on the fuses 15, making it increasingly difficult to cut the fuses 5 using the laser beam.

Referring to FIG. 1D, a window 55 is formed inside the guard ring 47 by sequentially etching the fifth insulating layer 50, the fourth insulating layer 35, the third insulating layer 30, the second conductive layer pattern 25b, and a portion of the second insulating layer 20. Accordingly, the remaining portion of the second insulating layer 20 has a predetermined thickness that is sufficient to partially absorb the energy applied to the fuses 15 by the laser beam. However, the thickness of the second insulating layer 20 covering the fuses 15 may be non-uniform throughout the whole surface of the semiconductor substrate 5. This is caused by a non-uniform etching ratio that occurs over the whole surface of the semiconductor substrate 5 during an etching process for forming the window 55.

In particular, the thicker the second to fifth insulating layers 20, 30, 35, 50 are, the less uniform the etching ratio becomes. It is generally difficult to make the thickness of the second insulating layer 20 remaining on the fuses 15 uniform over the whole surface of the semiconductor substrate 5. As a result, it is difficult to expect a successful repair process.

U.S. Application Publication No. 2002/0014680 to Isao Tottori discloses fuses in a semiconductor device and a method of manufacturing the same. According to 2002/0014680, a metal fuse formed inside a fuse box of the semiconductor device is connected to the source and drain regions of a gate formed on a semiconductor substrate. Thus, the metal fuse is formed of metal lines that are connected from the semiconductor substrate to the fuse being cut by the laser beam.

The metal lines are formed by the connection of tungsten (W) layers and aluminum (Al) layers, and the cutting of a metal fuse is done by using a current applied to the semiconductor device.

The use of current avoids both the attack of adjacent fuses from the conventional laser beam, and also the phenomenon where the metal fuse is not cut due to the non-uniform thickness of an insulating layer covering the fuses on predetermined regions of the semiconductor device.

Unfortunately, the above structure having the metal lines may increase the production cost of the semiconductor device by using at least one additional metal layer, and the direct contact of metals with the semiconductor substrate may increase the chances of metal contamination to the semiconductor device, causing the performance of the semiconductor device to deteriorate.

Embodiments of the invention address these and other disadvantages of the conventional art.

SUMMARY OF THE INVENTION

An embodiment of the invention provides a fuse box for a semiconductor device that is suitable for improving the uniformity of cuts performed on the fuses by a laser.

Another embodiment of the invention provides a method of manufacturing a fuse box of a semiconductor device that is capable of uniformly controlling the thickness of an insulating layer that remains on the fuses.

Still another embodiment of the invention provides a method of manufacturing a fuse box of a semiconductor device that is capable of minimizing the area required by the fuses.

BRIEF DESCRIPTION OF THE DRAWINGS

Exemplary embodiments of the invention will be readily apparent to those of ordinary skill in the art upon review of the detailed description that follows when taken in conjunction with the accompanying drawings, in which like reference numerals denote like parts.

DETAILED DESCRIPTION OF THE INVENTION

Reference will now be made in detail to exemplary embodiments of the invention, which is illustrated in the accompanying drawings.

FIGS. 2A to 2D are plan diagrams illustrating a fabrication method of a fuse box according to an embodiment of the invention.

Figure 1A:
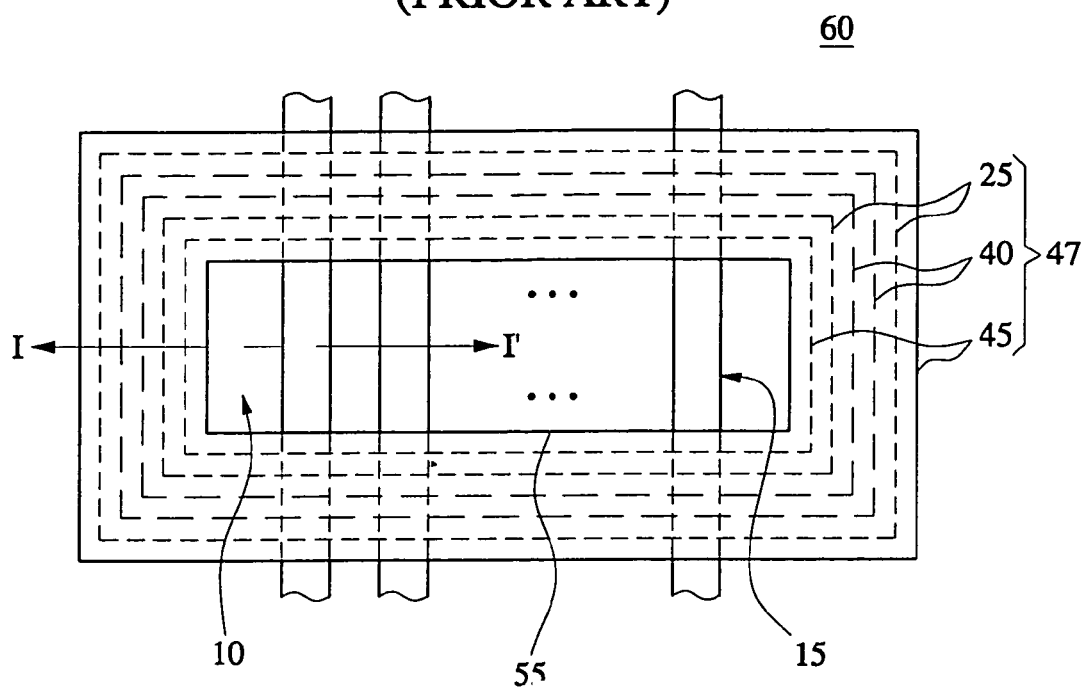
FIG. 1A is a plan diagram illustrating a fuse box formed according to a conventional art.
Figure 1B:
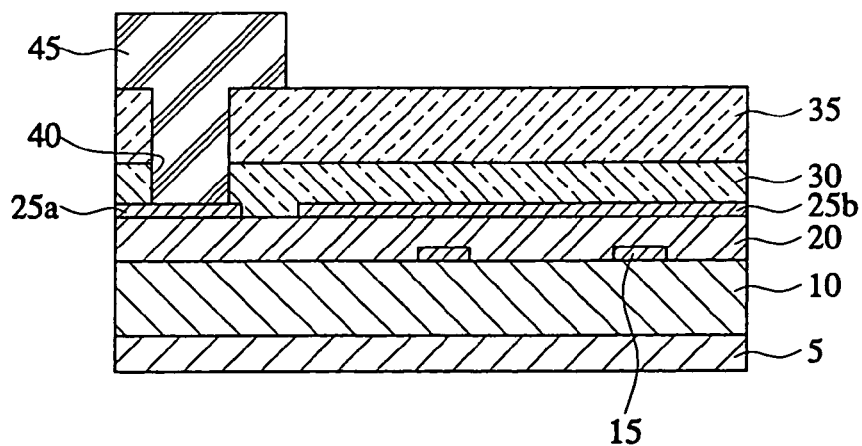
FIGS. 1B to 1D are cross-sectional diagrams taken along the line I–I' of FIG. 1A that illustrate a fabrication method of a conventional fuse box.
Figure 1C:
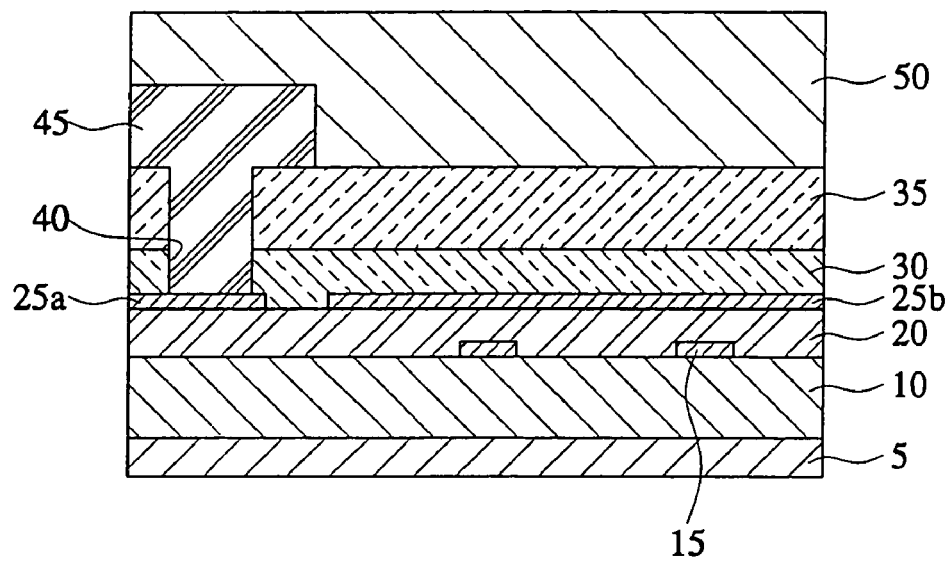
Figure 1D:
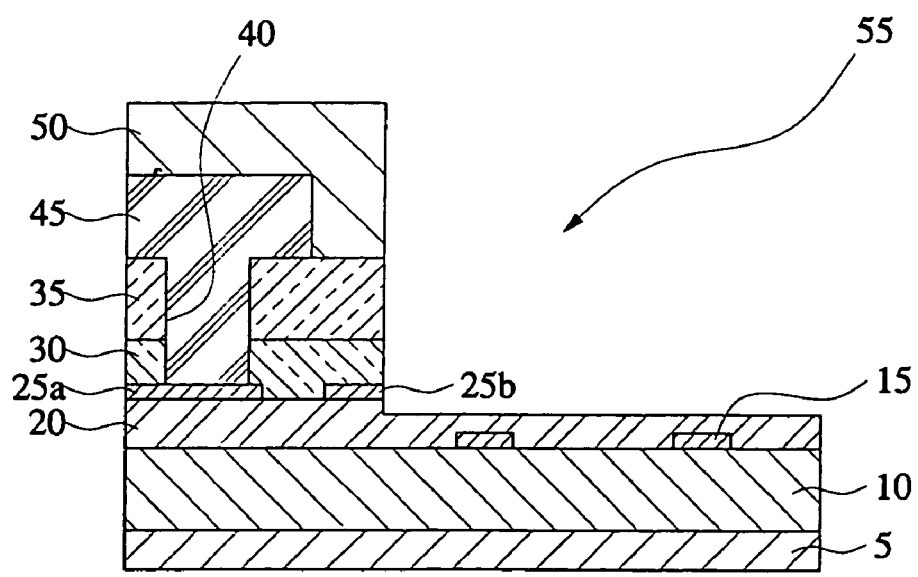
Figure 2A:
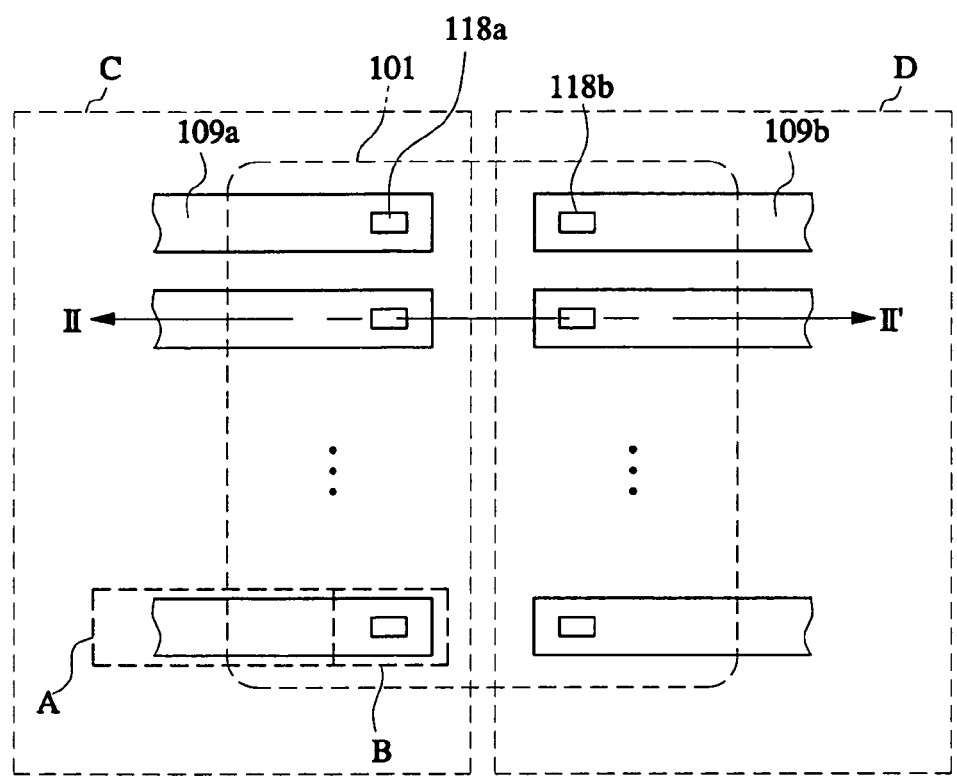
FIGS. 2A to 2D are plan diagrams illustrating a fabrication method of a fuse box according to an embodiment of the invention.

Referring to FIG. 2A, a predetermined number of lower lines 109a, which will be referred to as the first group, are placed to cross side C of the fuse region 101, and one selected from lower lines 109a is formed to extend inward towards the fuse region 101 from side C of the fuse region 101. Then a second group of lower lines 109b is placed to cross side D of fuse region 101 that is opposite side C, and one selected from the lower lines 109b is formed to extend toward the inside part of the fuse region 101 from side D of the fuse region 101. The second group of lower lines 109b has the same number as the first group of lower lines 109a.

Furthermore, first contact holes 118a, 118b are formed on the upper part of the first group and second group of lower lines 109a, 109b, and the first contact holes 118a, 118b are formed adjacent to the center of the fuse region 101.

The first group and second group of lower lines 109a, 109b are formed on a first region A and a second region B, respectively.

Figure 2B:
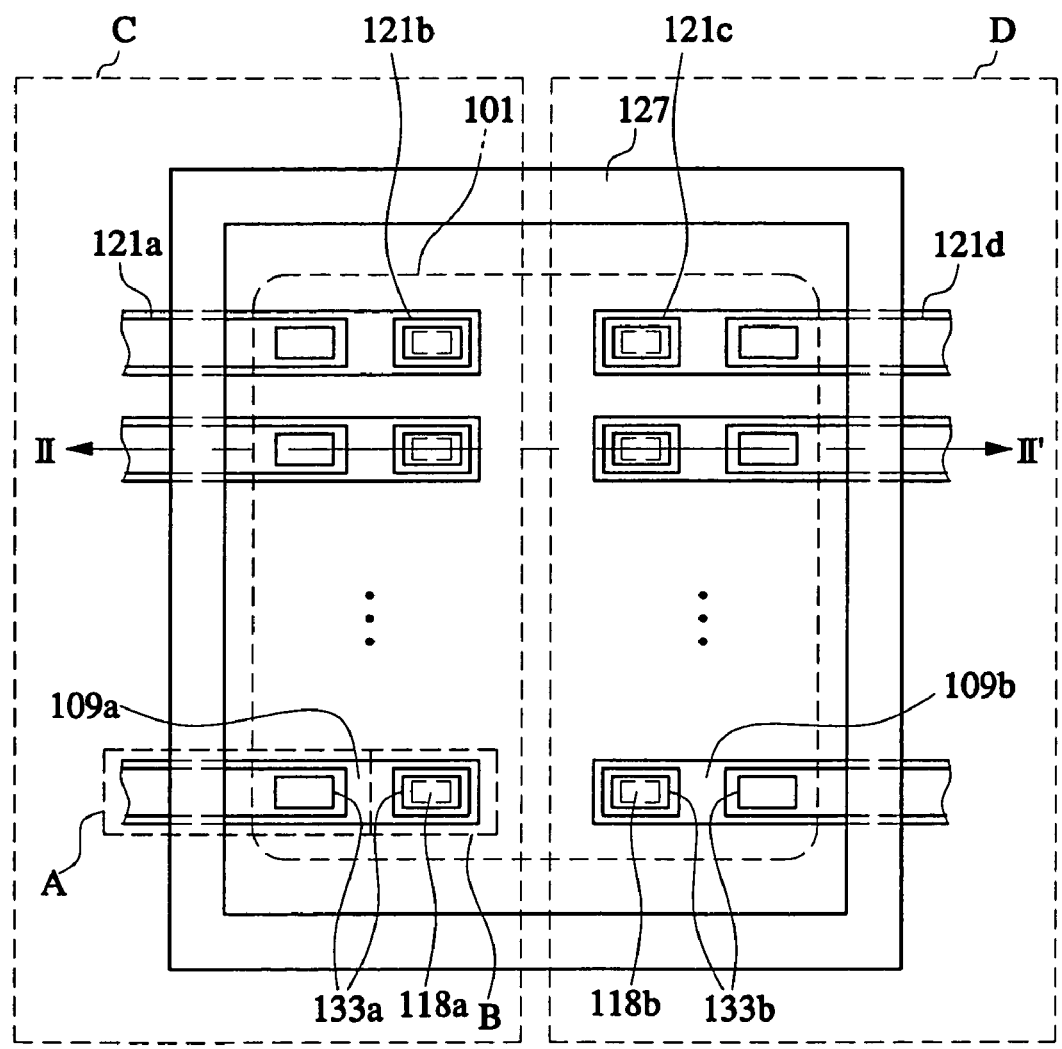

Referring to FIG. 2B, a first group of upper lines 121a and fuse pads 121b are placed on the array of the first group of the lower lines 109a in side C of the fuse region 101 to overlap the first group of the lower lines 109a, and the fuse pads 121b contact the first contact holes 118a. Furthermore, at the same time, a second group of upper lines 121d and fuse pads 121c are placed on the array of the second group of lower lines 109b in side D of the fuse region 101 to overlap the second group of lower lines 109b, and the fuse pads 121c contact the first contact holes 118b.

A plate line 127 is placed to surround the fuse region 101, and first fuse holes 133a and second fuse holes 133b are placed on the upper surfaces of the first group and the second group of upper lines 121a, 121d, and the upper surfaces of the fuse pads 121b, 121c.

The first and the second fuse holes 133a, 133b are formed to locate regions adjacent to the center of the fuse region 101 and regions close to the fuse region 101 respectively so as to contact with the first group and the second group of the upper lines 121a, 121d, and the fuse pads 121b, 121c.

That is, each of the first and second groups of upper lines 121a, 121d overlaps with a first region A of each of the first and second groups of lower lines 109a, 109b, and each of the upper surfaces of the fuse pads 121b, 121c is placed to overlap with the upper surface of each of the first contact holes 118a, 118b in the second region B of each of the first and second groups of lower lines 109a, 109b.

The first and second groups of upper lines 121a, 121d are placed under the plate line 127 to be used as a node of fuse line (not shown), and the plate line 127 determines the location where the guard ring (not shown) is formed.

The guard ring is a buffer layer to prevent an outer contaminant such as humidity from penetrating to the inside part of the fuse region 101.

Figure 2C:
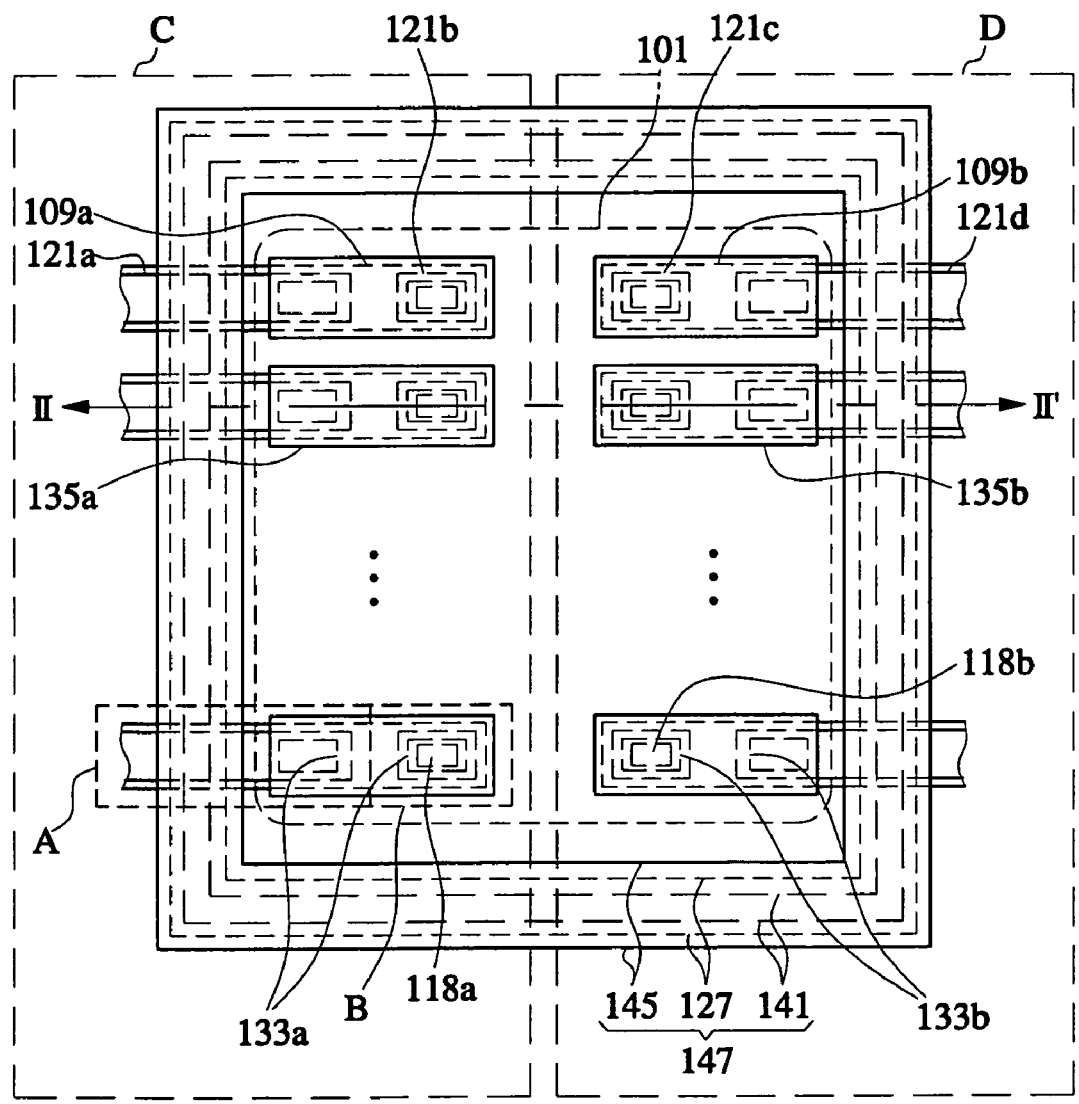

Referring to FIG. 2C, in the array that includes the first and second groups of lower lines 109a, 109b, the first contact holes 118a, 118b, the fuse pads 121b, 121c, the first and second groups of upper lines 121a, 121d, and the first and the second fuse holes 133a, 133b in side C and side D of the fuse region 101, lower metal lines are contacted with the first and second groups of the upper lines 121a, 121d, and the fuse pads 121b, 121c through the first and the second fuse holes 133a, 133b to form the first and the second group of fuses 135a, 135b.

Therefore, the first and second groups of fuses 135a, 135b are electrically connected to the first and second groups of lower lines 109a, 109b, the first and second groups of upper lines 121a, 121b, and the fuse pads 121b, 121c through the first contact holes 118a, 118b and the first and the second fuse holes 133a, 133b.

Furthermore, the guard ring 147 is placed by forming the second contact hole 141 on the plate line 127 surrounding the fuse region 101, and by forming the upper metal line 145 on the second contact hole 141.

The second contact hole 141 is formed along with the plate line 127 to have a smaller width than the plate line 127, and the upper metal line 145 is formed along with the second contact hole 141 to have a greater width than the second contact hole 141.

Figure 2D:
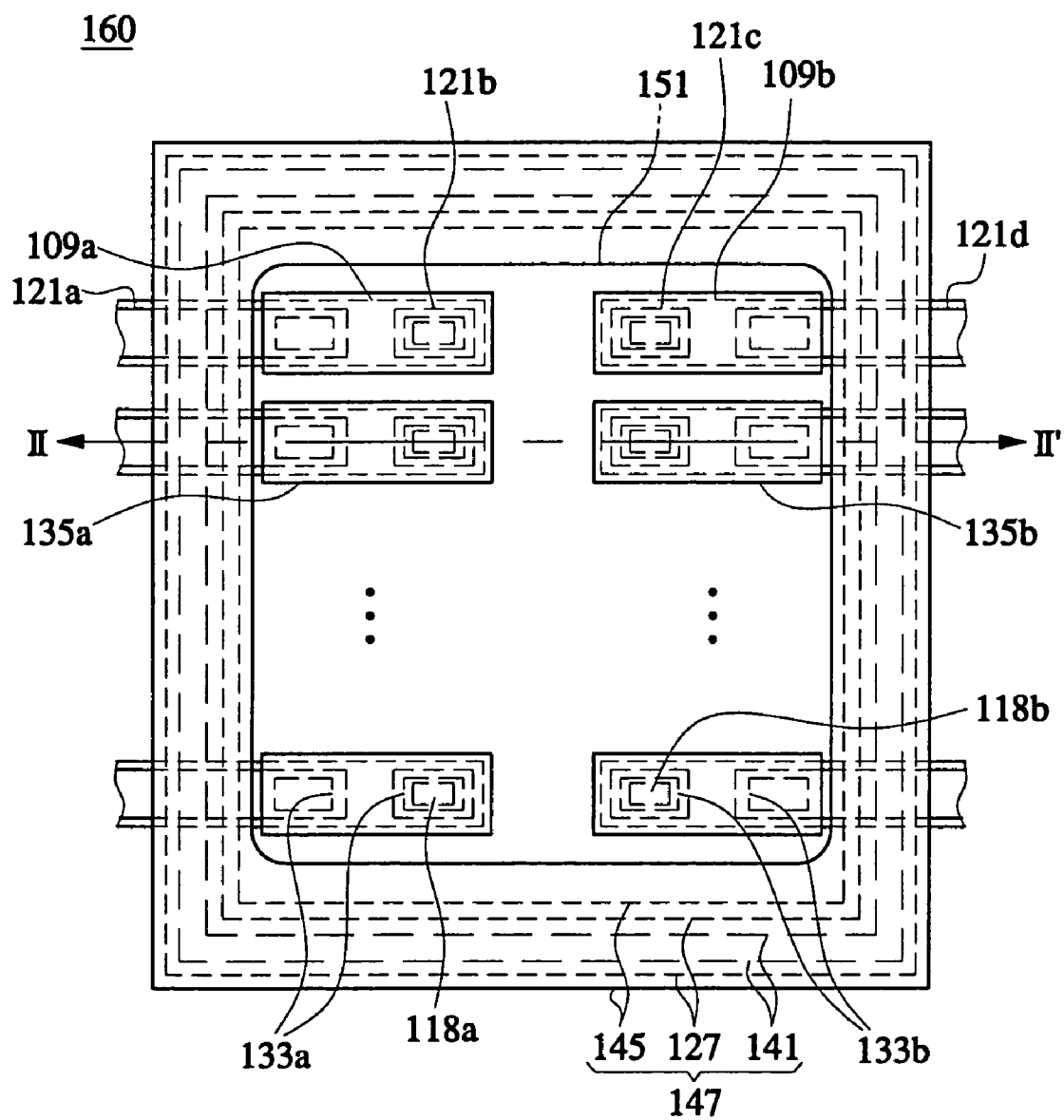

Referring to FIG. 2D, a window 151 surrounded by the upper metal line 145 is formed in the fuse box 160 that includes the first contact holes 118a, 118b placed in the first and second groups of lower lines 109a, 109b, the first and the second fuse holes 133a, 133b placed on the first and second groups of upper lines 121a, 121d and the fuse pads 121b, 121c, the first and second fuse groups 135a, 135b formed on the lower metal lines, the guard ring 147 having the second contact hole 141, and the upper metal line 145 formed on the plate line 127.

The window 151 is formed in the fuse region 101 to expose the first and second fuse groups 135a, 135b. That is, the window 151 is formed to eliminate the possibility that at least one fuse selected from the first and second fuse groups 135a, 135b is not cut by using a laser beam (not shown).

Furthermore, other fuse boxes according to other embodiments of the invention can be formed such that each of the first and second groups of fuses 135a, 135b is not in contact with each of the fuse pads 121b, 121c in the second region B of each of the first and second groups of lower lines 109a, 109b, but directly in contact with the second region B of each of the first and second groups of lower lines 109a, 109b.

Therefore, each of the first and second groups of fuses 135a, 135b is connected to each of the first and second groups of upper lines 121a, 121d in the first region A of each of the first and second groups of lower lines 109a, 109b, and is also connected to each of the first and second groups of lower lines 109a, 109b in the second region B of each of the first and second groups of lower lines 109a, 109b.

FIGS. 3A to 3D are cross-sectional diagrams taken along the line II–II' of FIG. 2A that further illustrate the fabrication method shown in FIGS. 2A to 2D.

Figure 3A:
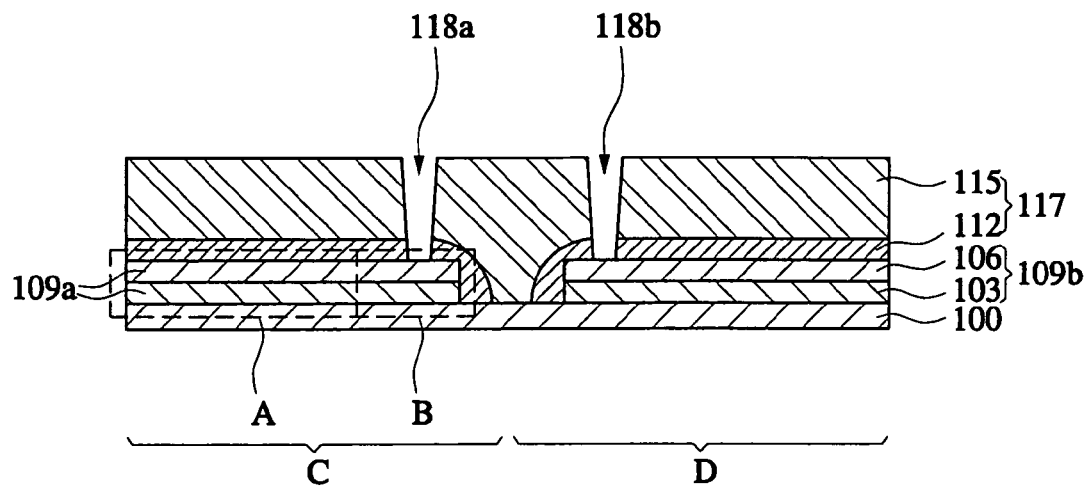
FIGS. 3A to 3D are cross-sectional diagrams taken along the line II–II' of FIG. 2A that further illustrate the fabrication method shown in FIGS. 2A to 2D.

Referring to FIGS. 2A and 3A, the first and second groups of lower lines 109a, 109b having the first region A and the second region B are formed on the semiconductor substrate 100 so that they are individually separated by a predetermined interval. A first insulating layer 112 is deposited on the semiconductor substrate 100 and the first and second groups of lower lines 109a, 109b. Then the first insulating layer 112 is etched to surround the top surface and sidewalls of the lower lines 109a, 109b and at the same time to expose the semiconductor substrate 100. A second insulating layer 115 is deposited on the first insulating layer 112 and semiconductor substrate 100. Next, first contact holes 118a, 118b are formed in the first and the second insulating layers 112, 115 to expose the second regions B of the lower lines 109a, 109b.

Preferably, each of the first and second groups of lower lines 109a, 109b extends inwardly from side C or side D of the fuse region 101 to face each other. That is, each of the first group of lower lines 109a is directed towards the inside part of fuse region 101 from side C of fuse region 101, and each of the second group of lower lines 109b is directed towards the inside part of fuse region 101 from side D of the fuse region 101.

In the specification below, the first and the second insulating layers 112, 115 will be commonly referred to as a lower interlayer insulating layer 117.

Each of the lower lines 109a, 109b can be formed of a poly silicon layer 103 and a tungsten silicide (WSi) layer 106 stacked in sequence, or formed of a different kind of metal silicide layer including the poly silicon layer 103.

Figure 3B:
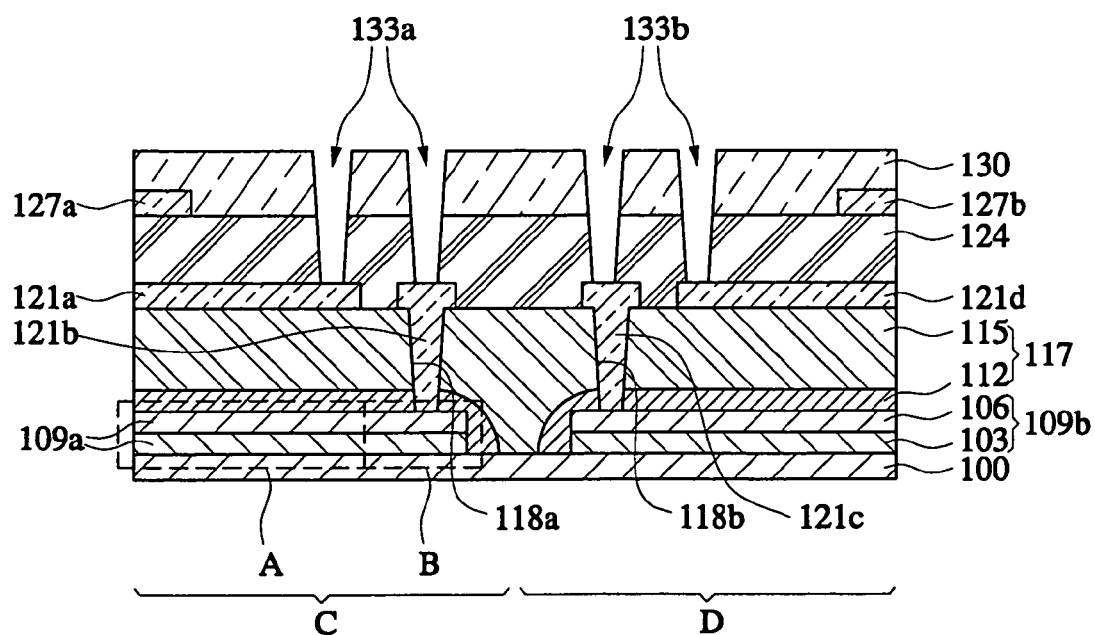

Referring to FIG. 2B and FIG. 3B, the first and second groups of upper lines 121a, 121d and fuse pads 121b, 121c are formed on the semiconductor substrate having the lower lines 109a, 109b and the lower interlayer insulating layer 117. A third insulating layer 124 is deposited on the upper lines 121a, 121d, the fuse pads 121b, 121c, and the second insulating layer 115. Plate lines 127a, 127b are formed on the third insulating layer 124, and a fourth insulating layer 130 is formed on the third insulating layer 124 and the plate lines 127a, 127b. A first and second fuse holes 133a, 133b are formed on the third and the fourth insulating layers 124, 130 to expose the upper surface of each of the upper lines 121a, 121d.

The fuse pads 121b, 121c are connected to the lower lines 109a, 109b through the first contact holes 118a, 118b that penetrate the first and the second insulating layers 112, 115 in the second region B of the lower lines 109a, 109b.

The upper lines 121a, 121d overlap in the first region A of the lower lines 109a, 109b, and the plate lines 127a, 127b are a sectional view of the plate line 127 taken along the line of II–II' of FIG. 2B.

The first fuse hole 133a is formed by exposing the upper surface of the upper line 121a and the upper surface of the fuse pad 121b on side C of the fuse region 101 of FIG. 2B, and, at the same time, the second fuse hole 133b is formed by exposing the upper surface of the upper line 121d and the upper surface of the fuse pad 121c on side D of the fuse region 101 of FIG. 2B.

Preferably, the upper line 121a and the lower line 109a are directed towards the outside of side C from the inside part of the fuse region 101, and the upper line 121d and the lower line 109b are directed towards the outside of side D thereof from the inside part of the fuse region 101.

The upper line 121 can be formed of a doped polysilicon layer and a tungsten silicide layer stacked in sequence, formed of a doped polysilicon layer and a different kind of metal silicide layer, or formed only of a tungsten (W) layer.

The plate line 127 is formed of a doped poly silicon layer and also functions as a support plate during the formation of the guard ring (not shown).

Figure 3C:
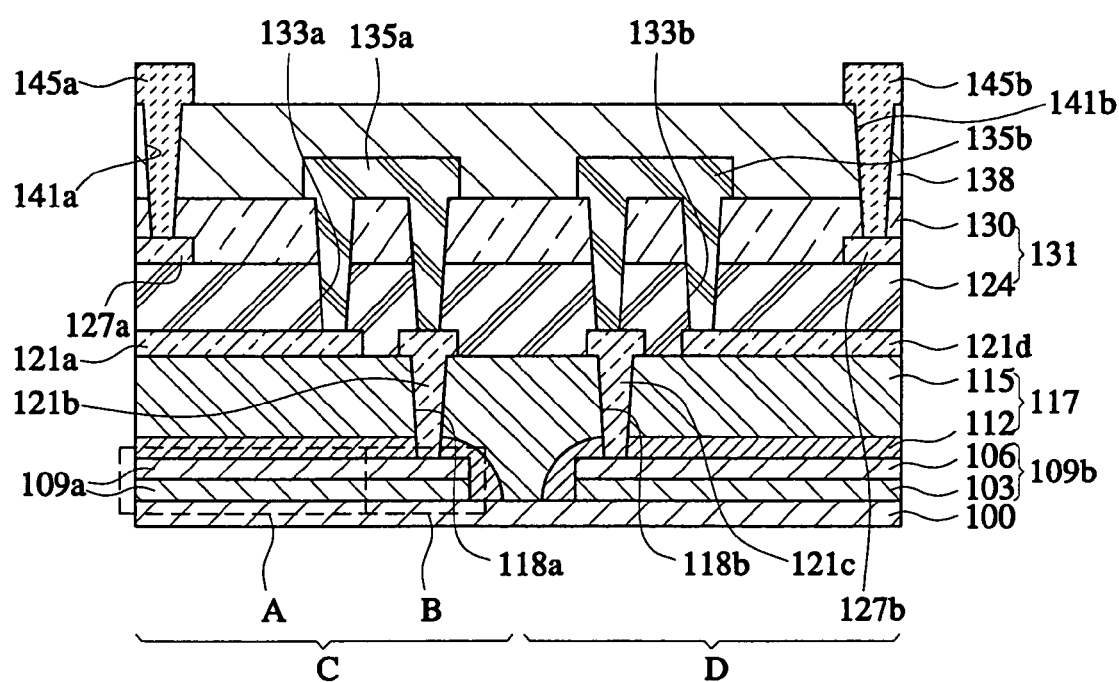

Referring to FIGS. 2C and 3C, the first and second fuse groups 135a, 135b are formed on the semiconductor substrate 100 having the resultant of FIG. 3B to bury the first and second fuse holes 133a, 133b. The first and second fuse groups 135a, 135b are formed of lower metal lines. A fifth insulating layer 138 is deposited on the fuse groups 135a, 135b and the fourth insulating layer 130. The guard ring 147 (FIG. 2C) is formed of the plate lines 127a, 127b, second contact holes 141a, 141b, and upper metal lines 145a, 145b. At this time, the second contact holes 141a, 141b are formed in the fourth and the fifth insulating layers 130, 138 to expose the upper surfaces of the plate lines 127a, 127b. The upper metal lines 145a, 145b bury the second contact holes 141a, 141b.

The fuse 135a formed on side C of the fuse region 101 contacts the upper line 121a at one end, and connects to the fuse pad 121b at the other end through both ends of the first fuse hole 133a. In the same way, the fuse 135b formed on side D of the fuse region 101 contacts the upper line 121d at one end, and connects to the fuse pad 121c at the other end through both ends of the second fuse hole 133b.

Therefore, each of the fuses 135a, 135b forms a circuit with conductive layers 109a, 109b, 121a, 121b through each of the first and the second fuse holes 133a, 133b at its lower side, and the third and the fourth insulating layers 124, 130 are commonly referred to as an upper interlayer insulating layer 131.

Figure 3D:
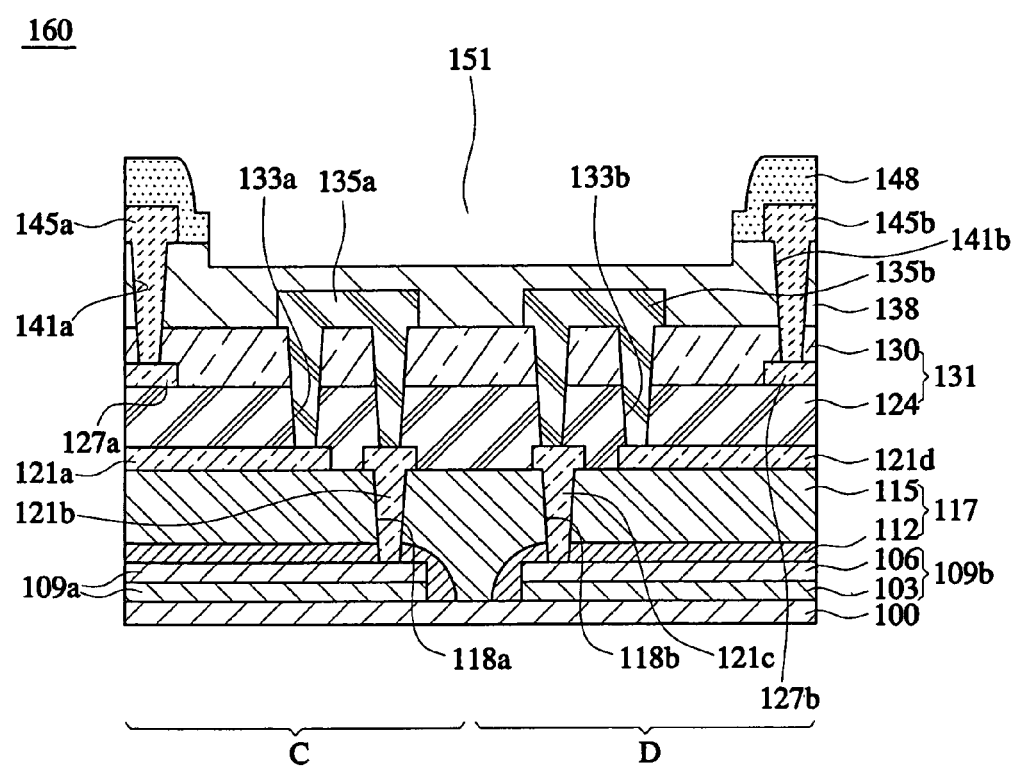

Referring to FIGS. 2D and 3D, a sixth insulating layer 148 is deposited on the whole surface of the semiconductor substrate 100 having the resultant structure of FIG. 3C, and then, the fifth and the sixth insulating layers 138, 148 are sequentially etched to form the fifth insulating layer to a predetermined thickness on the upper surface of the fuses 135a, 135b. At this time, a window 151 is formed using the fifth and the sixth insulating layers 138, 148.

The sixth insulating layer 148 can be formed of more than one insulating layer. The window 151 is formed in alignment with the fuse region 101 of FIG. 2C, that is, on the upper part of the fuses 135a, 135b between the upper metal lines 145a, 145b.

At this time, the direction of an input electrical signal to the fuse 135a is the same direction as an output electrical signal because the lower line 109a and the upper line 121a are connected to the fuse 135a through the first fuse hole 133a and the fuse pad 121b. That is, the input electrical signal applied to the lower line 109a or the upper line 121a turns into the output electrical signal derived from the upper line 121a or the lower line 109a through the fuse 135a.

Identifying the directions of the input and output electrical signals allow the first group and the second group of the fuses 135a, 135b of FIGS. 2C or 2D to be formed in an array shape. The array shape, in comparison to the conventional art, allows the density of the fuses 135a, 135b in a fuse box 160 to increase, reduces the number of fuse boxes 160 required in the semiconductor device, and secures more layout space for peripheral circuit lines with the lower and upper lines 109a, 109b, 121a, 121b connecting to the fuse box 160.

Therefore, the above structure of the fuse box 160 helps to connect the peripheral circuit lines either to each end of the first and second groups of lower lines 109a, 109b of the fuse box 160 of FIG. 2D, and/or to each end of the first and second groups of upper lines 121a, 121d. Thus, the peripheral circuit lines can simultaneously transverse the lower part of the guard ring 147 by using the additional space.

Figure 3E:
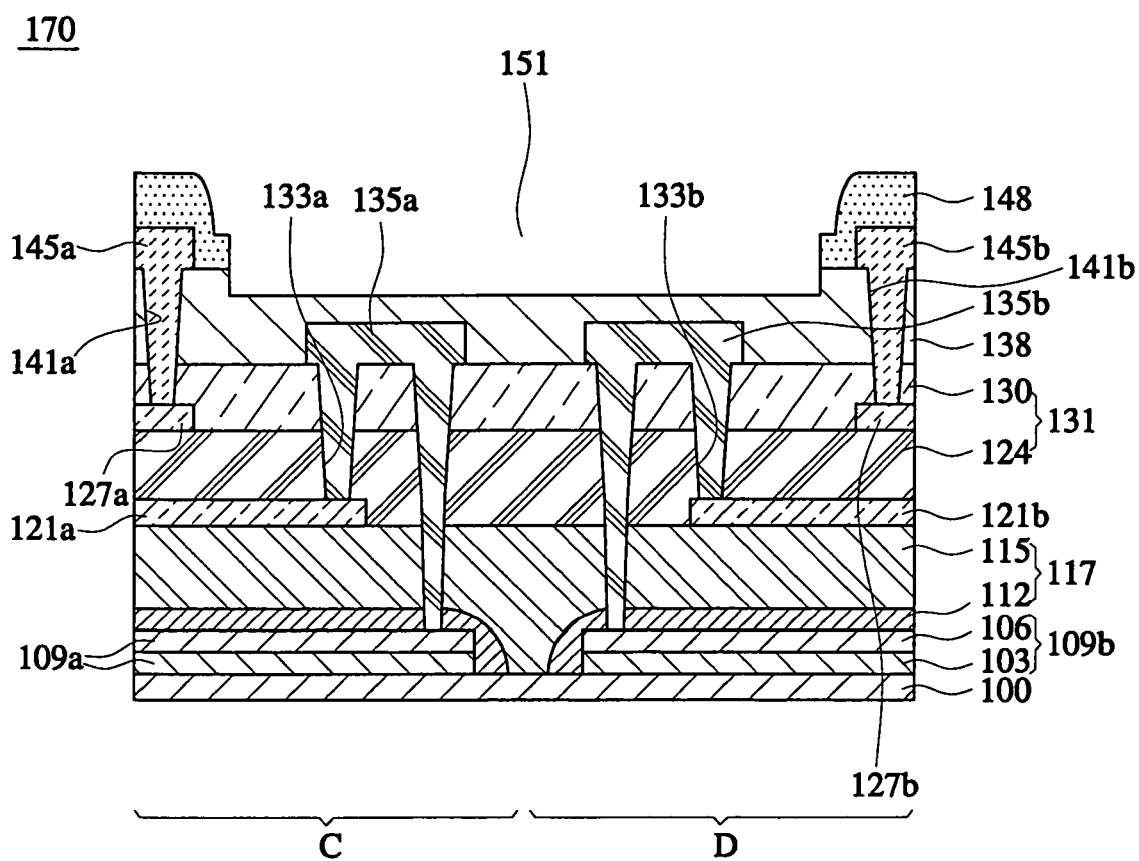
FIG. 3E is a cross-sectional diagram illustrating another embodiment of the invention.

FIG. 3E is a cross-sectional diagram illustrating another embodiment of the invention.

Referring to FIGS. 2A to 2D and FIG. 3E, it is different for the first contact holes 118a, 118b and the fuse pads 121b, 121c of FIG. 3D, not to be formed in a fuse box 170. In FIG. 3D, the first contact holes 118a, 118b expose the second regions of the lower lines 109a, 109b respectively, and is buried with the fuse pads 121b, 121c respectively.

Further, the fabrication processes in FIGS. 2A to 2D, and FIGS. 3A to 3D are performed in FIG. 3E in the same order, and since the use of each pattern is the same, the same numerals will be provided if possible.

That is, according to another embodiment of the present invention, the fuses 135a, 135b of the fuse box 170 do not contact the fuse pads 121b, 121c in the second region B of the lower lines 109a, 109b of FIG. 3D, and for example, one end of the fuse 135a formed on one side C of the fuse region 110 contacts the upper line 121a, and the other end of the fuse 135a dose directly contact the second region B of the lower line 109a.

As above, since the first contact holes 118a, 118b do not placed in the lower interlayer insulating layer 117, which is formed of the first and the second insulating layers 112, 115, and the modified embodiment according to the present method can achieve fabrication processes simpler than an exemplary embodiment thereof. Therefore, since the fuse boxes 160, 170 according to the present invention use metal lines as the fuses 135a, 135b, the present invention has the advantage of easily controlling the predetermined thickness of the fifth insulating layer 138, which is remained on the upper part of the fuses 135a, 135b through the formation of the window 151 unlike the conventional art, and of uniformly controlling the predetermined thickness on one selected semiconductor substrate 100 or on the all semiconductor substrates 100.

Figure 3F:
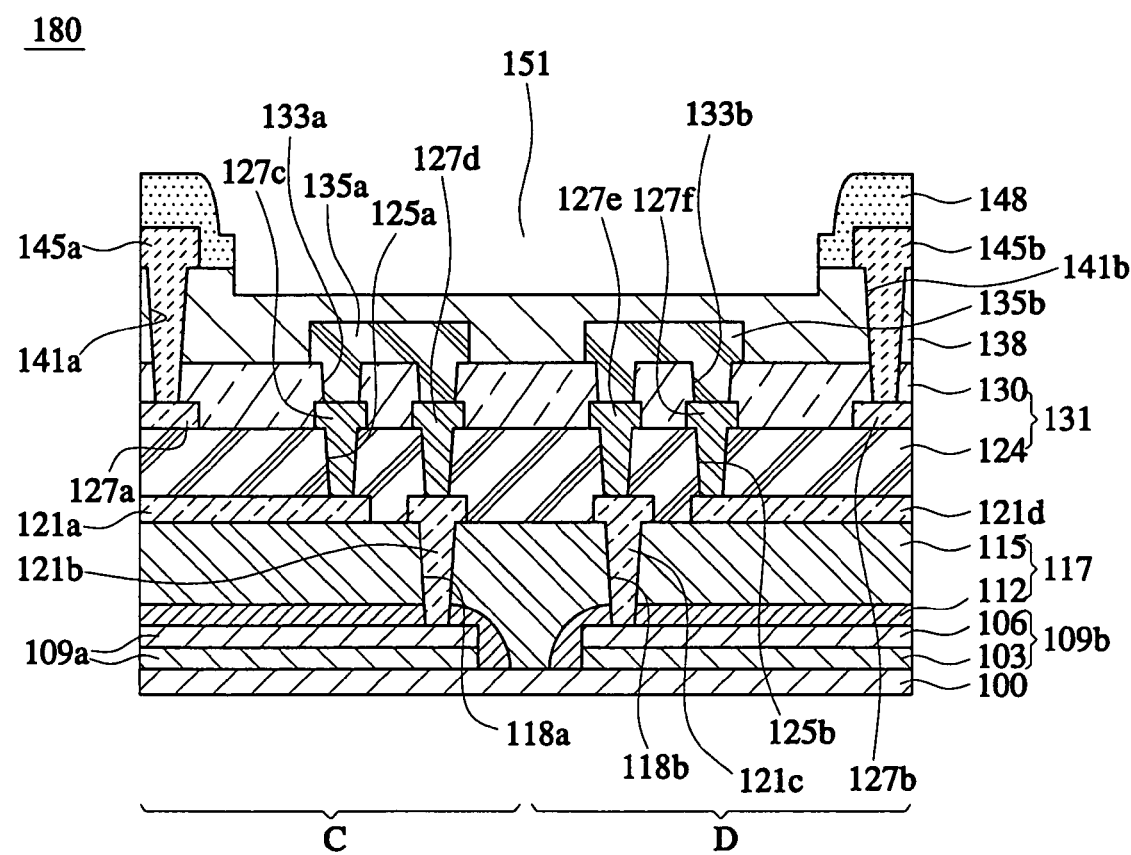
FIG. 3F is a cross-sectional diagram illustrating yet another embodiment of the invention.

FIG. 3F is a cross-sectional diagram illustrating yet another embodiment of the invention.

Referring to FIGS. 2A to 2D and FIG. 3F, pad holes are formed on the semiconductor substrate 100 having the third insulating layer 124 to expose the upper surfaces of the upper lines 121a, 121d and the fuse pads 121b, 121c unlike FIG. 3D. Then the plate lines 127a, 127b are placed on the third insulating layer, and at the same time the pad holes are buried with plate pads 127c, 127d, 127e, 127f. A fourth insulating layer 130 is formed on the third insulating layer, the plate pads and the plate lines. Next, the fuse holes 133a, 133b are formed in the fourth insulating layer 130 to expose the upper surfaces of the plate pads 127c, 127d, 127e, 127f. Fuses 135a, 135b are then formed in the fuse holes 133a, 133b. Fabrication processes performed on the semiconductor substrate after the formation of the fuses 135a, 135b are the same as those illustrated in FIG. 3D and FIG. 3E.

Therefore, the fabrication processes in FIGS. 2A to 2D, and FIGS. 3A to 3D are performed in FIG. 3F in the same order to form a fuse box 180. Since the use of each pattern is the same, the same numerals will be provided if possible.

In the fuse box 180, one end of the fuse 135a in one side C of the fuse region 101 of FIG. 2A is electrically connected to one plate pad 127c and the upper line 121a, and the other end of the fuse 135a is connected to another plate pad 127d, a fuse pad 121b and a second region B of the lower line 109a. Further, in the other side D of the fuse region 101 of FIG. 2A, one end of the fuse 135b is connected to one plate pad 127e, a fuse pad 121c, and the second region B of the lower line 109b, and the other end of the fuse 135b is connected to another plate pad 127f and the upper line 121d.

Further, the plate pads 127c, 127d, 127e, 127f are connected to the upper lines 121a, 121d, and the fuse pads 121b, 121c in one side C and the other side D of the fuse region 101 to use as circuits of the fuse 135a, 135b.

As described above, the invention provides the fuse box of a semiconductor device having the fuses formed of metal lines, the lower lines and the upper lines in an array shape, and the lower and the upper lines are connected to the fuses. The structure of the fuse box helps to secure the more occupation space of connecting the lower and the upper lines to the peripheral circuit lines in comparison with the conventional art, and to improve the process ability of the semiconductor device and the ability of drawing layouts in design.

Embodiments of the invention will now be described in a non-limiting way.

In accordance with an exemplary embodiment, the invention provides a fuse box of a semiconductor device including a semiconductor substrate having a fuse region, and lower line having a first region and a second region in the fuse region on the semiconductor substrate. The upper line is placed on the upper part of the lower line to overlap the first region of the lower line. A fuse is placed on the upper part of the upper line. The fuse is electrically connected to the second region of the lower line and the upper line.

Preferably, the fuse is formed of metal line, and the lower and the upper lines extend in the same direction toward the outside part of the fuse region from the inside part of the fuse region.

Preferably, the fuse box further includes the lower interlayer insulating layer interposed between the lower line and the upper line, and an upper interlayer insulating layer interposed between the upper line and the fuse.

In an exemplary embodiment, one end of the fuse is electrically connected to the upper line through a first fuse contact hole penetrating the upper interlayer insulating layer. The other end of the fuse is electrically connected to the second region of the lower line through a second fuse contact hole penetrating the upper interlayer insulating layer and the lower interlayer insulating layer.

Alternatively, the fuse box may further include a fuse pad penetrating a predetermined region of the lower interlayer insulating layer to contact a second region of the lower line. In this case, one end of the fuse is preferably electrically connected to the upper line through a first fuse contact hole penetrating the upper interlayer insulating layer. The other end of the fuse is preferably electrically connected to the fuse pad through a second fuse contact hole penetrating the upper interlayer insulating layer.

The fuse box may further include plate lines and plate pads, which are formed on the upper parts of the upper line and the fuse pad, respectively, and separated from each other. In this case, one end of the fuse may be connected to the upper line and one plate pad selected from the plate pads, and the other end of the fuse may be electrically connected to the upper line and the lower line with another plate pad selected from the plate pads.

Preferably, the fuse pad is separated from the upper line on the lower interlayer insulating layer, and is formed of the same layer as the upper line, and the plate pads are separated from the plate lines on the upper interlayer insulating layer, and are formed of the same layer as the plate line.

In accordance with another exemplary embodiment, the invention provides a fuse box of a semiconductor device including a semiconductor substrate having a fuse region, and a first group and a second group of parallel lower lines located on one side and the opposite side of the fuse region, respectively. Each of the first group of the lower lines includes a first region adjacent to the periphery of the fuse region and a second region close to the center of the fuse region, and extends toward the outside part of the fuse region.

The second group of lower lines are placed in the extensions of the first group of the lower lines. Each of the second group of the lower lines includes a first region adjacent to the periphery of the fuse region and a second region close to the center of the fuse region, and extends toward the outside part of the fuse region. A first group of upper lines is placed to overlap the first region of the first group of lower lines on the upper part of the first group of lower lines. In the same way, a second group of upper lines is placed to overlap the first region of the second group of the lower lines on the upper part of the second group of lower lines. A first group of fuses is placed on the upper part of the first group of upper lines. Each of the first group of the fuses is electrically connected to the second region of the first group of lower lines placed under the first group of the fuses, and also to the first group of upper lines. A second group of fuses is placed on the upper part of the second group of upper lines. Each of the second group of fuses is electrically connected to the second region of the second group of lower lines placed under the second group of fuses, and also to the second group of upper lines.

Preferably, the first and second groups of fuses are formed of metal lines, and each of the first group of lower and upper lines extends toward the outside part of the fuse region.

Preferably, each of the second group of lower and upper lines extends in a direction opposite to each of the first group of lower and upper lines of the fuse region from the other side thereof.

Preferably, the fuse box may further include a lower interlayer insulating layer interposed between the first and the second groups of lower lines and upper lines, and an upper interlayer insulating layer interposed between the first and the second groups of upper lines and fuses.

Preferably, one end of the first and the second groups of fuses is electrically connected to the first and the second groups of upper lines through first fuse contact holes penetrating the upper interlayer insulating layer, and the other end of the first and second groups of fuses is electrically connected to the second regions of the lower lines through second fuse contact holes penetrating the upper interlayer insulating layer and the lower interlayer insulating layer.

In another exemplary embodiment, the fuse box may further include fuse pads penetrating predetermined regions of the lower interlayer insulating layer to contact the second regions of the first and second groups of lower lines. In this case, preferably, one end of each of the first and the second groups of fuses is electrically connected to the first and the second groups of upper lines through the first fuse contact holes penetrating the upper interlayer insulating layer, and the other end of each of the first and second groups of fuses is electrically connected to the fuse pads through the second fuse contact holes penetrating the upper interlayer insulating layer.

The fuse box may further include plate lines and plate pads formed on the upper part of each of the first group and the second group of upper lines and the upper surface of each of the fuse pads, and separated from one another. In this case, one end of each of the first group of fuses may be connected to each of the first group of upper lines with one plate pad selected from the plate pads, and the other end of each of the first group of fuses may be electrically connected to each of the fuse pads and each of the lower lines with another plate pad.

In the fuse box, one end of each of the second group of fuses is in contact with each of the second group of upper lines with one of the plate pads, and the other end of each of the second group of fuses is electrically connected to each of the fuse pads and each of the lower lines with another plate pad.

Preferably, each of the fuse pads may be apart from each of the first group and the second group of upper lines on the lower interlayer insulating layer, and is formed of the same layer as each of the first group and the second group of upper lines. Also, each of the plate pads may be apart from each of the plate lines on the upper interlayer insulating layer, and is formed of the same layer as each of the plate lines.

In accordance with an exemplary embodiment, the invention provides a method of manufacturing a fuse box of a semiconductor device.

In an exemplary embodiment, the method of manufacturing the fuse box includes preparing a semiconductor substrate having a fuse region, and forming a lower line extending toward the inside part of the fuse region on the semiconductor substrate. The lower interlayer insulating layer is formed on the whole surface of the semiconductor substrate having the lower line. An upper line is formed to extend toward the inside part of the fuse region on the lower interlayer insulating layer and overlap the lower line. An upper interlayer insulating layer is formed on the whole surface of the semiconductor substrate having the upper line. Then, a fuse that is electrically connected to the lower line and the upper line in the fuse region, is formed on the upper interlayer insulating layer.

The method of manufacturing the fuse box includes forming a first contact hole in the lower interlayer insulating layer to expose a predetermined region of the lower line. A fuse pad is formed on the lower interlayer insulating layer to be apart from the upper line and fill the first contact hole. Preferably, the method further includes electrically connecting the fuse on the upper interlayer insulating layer to the upper line and the fuse pad.

Preferably, the predetermined portion may be a region adjacent to the center of the fuse region. The fuses are preferably cut with a laser.

In accordance with another exemplary embodiment, the method of manufacturing the fuse box may include preparing a semiconductor substrate having a fuse region, forming a first group of parallel lower lines in one side of the fuse region, and forming a second group of parallel lower lines in the other side of the fuse region at the same time to locate in the extension lines of the first group of the lower lines, in which each of the first group and the second group of lower lines includes a first region adjacent to the periphery of the fuse region, and a second region close to the center of the fuse region. A lower interlayer insulating layer is formed on the whole surface of the semiconductor substrate having the first and the second groups of lower lines. A first group of parallel upper lines overlapping the first region of the first group of lower lines, and a second group of upper lines overlapping the first region of the second group of lower lines are formed on the lower interlayer insulating layer. An upper interlayer insulating layer is formed on the whole surface of the semiconductor substrate having the first and the second groups of upper lines.

Then, a first group of fuses overlapping the first group of lower lines and a second group of fuses overlapping the second group of lower lines are formed on the upper interlayer insulating layer. Both ends of each of the first group of fuses are electrically connected to the first group of upper lines and the first group of lower lines, respectively, that are located under the fuses. Both ends of each of the second group of fuses are electrically connected to the second group of upper lines and the second group of lower lines, respectively, that are located under the fuses.

Preferably, the method of manufacturing the fuse box further includes forming first contact holes in the lower interlayer insulating layer to expose predetermined portions of the first group and the second group of lower lines, and forming fuse pads on the lower interlayer insulating layer to be apart from the first group and the second group of upper lines and to fill the first contact holes.

Preferably, the method of manufacturing the fuse box includes electrically connecting the first group and the second group of fuses on the upper interlayer insulating layer to the first group and the second group of upper lines with the fuse pads.

Preferably, the predetermined portions may be regions adjacent to the center of the fuse region, and the first group and the second group of fuses are cut using a laser.

While the invention has been particularly shown and described with reference to exemplary embodiments thereof, it will be understood by those skilled in the art that the foregoing and other changes in form and details may be made therein without departing from the spirit and scope of the invention as defined in the following claims.

What is claimed is:

1. A fuse box of a semiconductor device comprising:
   a semiconductor substrate having a fuse region;
   a lower line placed in the fuse region of the semiconductor substrate, and having a first region and a second region;
   an upper line placed on an upper part of the lower line to overlap the first region of the lower line; and
   a fuse placed on an upper part of the upper line, and electrically connected to the second region of the lower line and the upper line.

2. The fuse box of a semiconductor device according to claim 1, wherein the fuse is formed of metal line.

3. The fuse box of a semiconductor device according to claim 1, wherein the lower and the upper lines are extended in the same direction toward an outside part of the fuse region from an inside part thereof.

4. The fuse box of a semiconductor device according to claim 1, further comprising:
   a lower interlayer insulating layer interposed between the lower and the upper lines; and
   an upper interlayer insulating layer interposed between the upper line and the fuse.

5. The fuse box of a semiconductor device according to claim 4, wherein one end of the fuse is electrically connected to the upper line through a first fuse contact hole that penetrates the upper interlayer insulating layer, and the other end of the fuse is electrically connected to the second region of the lower line through a second fuse contact hole that penetrates the upper interlayer insulating layer and the lower interlayer insulating layer.

6. The fuse box of a semiconductor device according to claim 4, further comprising a fuse pad that penetrates a predetermined region of the lower interlayer insulating layer to contact the second region of the lower line, wherein one end of the fuse is electrically connected to the upper line through a first fuse contact hole that penetrates the upper interlayer insulating layer, and the other end of the fuse is electrically connected to the fuse pad through a second fuse contact hole penetrating the upper interlayer insulating layer.

7. The fuse box of a semiconductor device according to claim 6, further comprising:
   a first plate pad formed on an upper surface of the fuse pad;
   a second plate pad formed on an upper surface of the upper line, wherein one end of the fuse is electrically connected to the upper line by the second plate pad, and wherein the other end of the fuse is electrically connected to the fuse pad by the first plate pad; and
   a plate line separated from the first and second plate pads.

8. The fuse box of a semiconductor device according to claim 6, wherein the fuse pad is separated from the upper line on the lower interlayer insulating layer, but is formed from the same layer as the upper line.

9. The fuse box of a semiconductor device according to claim 7, wherein the first and second plate pads are separated from the plate line in the upper interlayer insulating layer, but are formed of the same layer as the plate line.

10. A semiconductor structure comprising:
    a semiconductor substrate having a fuse region;
    a first lower line placed on one side of the fuse region that extends toward an outside part of the fuse region, the first lower line having a first region adjacent to a periphery of the fuse region and a second region close to a center of the fuse region;
    a second lower line placed on another side of the fuse region that extends toward the outside part of the fuse region, the second lower line having a first region adjacent to the periphery of the fuse region and a second region close to the center of the fuse region, the first lower line and the second lower line symmetrical to each other about a center of the fuse region;
    a first upper line placed to overlap the first region of the first lower line;

a second upper line placed to overlap the first region of the second lower line;

a first fuse that is electrically connected to the second region of the first lower line and that is in contact with the upper surface of the first upper line; and a second fuse that is electrically connected to the second region of the second lower line and that is in contact with the upper surface of the second upper line.

11. The semiconductor structure according to claim 10, wherein the first and the second fuses are formed of metal lines.

12. The fuse box of a semiconductor device according to claim 10, wherein the first lower and the first upper lines extend in a first direction.

13. The semiconductor structure according to claim 12, wherein the second lower and the second upper lines extend in a second direction opposite to the first direction.

14. The semiconductor structure according to claim 10, further comprising:

a lower interlayer insulating layer interposed between the first lower line and the first upper line, and between the second lower line and the second upper line; and an upper interlayer insulating layer interposed between the first upper line and the first fuse, and between the second upper line and the second fuse.

15. The semiconductor structure according to claim 14, wherein an end of the first and the second fuses is electrically connected to the first and the second upper lines, respectively, through first fuse contact holes penetrating the upper interlayer insulating layer, and wherein another end of the first and the second fuses is electrically connected to the second regions of the first and second lower lines, respectively, through second fuse contact holes penetrating the upper and the lower interlayer insulating layers.

16. The semiconductor structure according to claim 14, further comprising first and second fuse pads penetrating predetermined regions of the lower interlayer insulating layer to contact the second regions of the first and the second lower lines, respectively, wherein an end of the first and the second fuse is electrically connected to the first and the second upper line, respectively, through first fuse contact holes penetrating the upper interlayer insulating layer, and wherein another end of the first and the second fuse is electrically connected to the first and the second fuse pad, respectively, through second fuse contact holes penetrating the upper interlayer insulating layer.

17. The semiconductor structure according to claim 16, further comprising:

a first plate pad formed on an upper surface of the first upper line, wherein an end of the first fuse is electrically connected to the first upper line by the first plate pad;

a second plate pad formed on an upper surface of the first fuse pad, wherein another end of the first fuse is electrically connected to the first lower line by the second plate pad and the first fuse pad; and a first plate line separated from the first and second plate pads.

18. The semiconductor structure according to claim 17, further comprising:

a third plate pad formed on an upper surface of the second upper line, wherein an end of the second fuse is electrically connected to the second upper line by the third plate pad;

a fourth plate pad formed on an upper surface of the second fuse pad, wherein another end of the second fuse is electrically connected to the second lower line by the fourth plate pad and the second fuse pad; and a second plate line separated from the third and fourth plate pads.

19. The semiconductor structure according to claim 16, wherein the first and the second fuse pads are separated from the first and the second upper lines, but are formed from the same layer as the first and the second upper lines.

20. The semiconductor structure according to claim 18, wherein the first, second, third, and fourth plate pads are separated from the first and second plate lines on the upper interlayer insulating layer, and are formed from the same layer as the first and second plate lines.

* * * * *